(12) United States Patent
Gunsay

(10) Patent No.: US 10,114,054 B1
(45) Date of Patent: Oct. 30, 2018

(54) FILTERED DIELECTRIC SENSOR APPARATUS

(71) Applicant: Metin A Gunsay, Bluffdale, UT (US)

(72) Inventor: Metin A Gunsay, Bluffdale, UT (US)

( * ) Notice: Subject to any disclaimer, the term of this patent is extended or adjusted under 35 U.S.C. 154(b) by 0 days.

(21) Appl. No.: 16/004,379

(22) Filed: Jun. 9, 2018

Related U.S. Application Data

(63) Continuation-in-part of application No. 14/709,212, filed on May 11, 2015, now Pat. No. 10,018,494.

(60) Provisional application No. 62/517,785, filed on Jun. 9, 2017.

(51) Int. Cl.
*G01F 23/26* (2006.01)
*G01R 27/26* (2006.01)
*G05D 9/12* (2006.01)

(52) U.S. Cl.
CPC ....... *G01R 27/2664* (2013.01); *G01F 23/263* (2013.01); *G05D 9/12* (2013.01)

(58) Field of Classification Search
CPC .............................. G01F 23/26; G01F 23/266
See application file for complete search history.

(56) References Cited

U.S. PATENT DOCUMENTS

| | | | |
|---|---|---|---|
| 3,391,547 A | 7/1968 | Kingston | |
| 3,774,238 A * | 11/1973 | Hardway, Jr. | ......... G01F 23/263 137/392 |
| 3,864,974 A | 2/1975 | Rauchwerger | |
| 3,874,237 A | 4/1975 | Zwarts | |
| 3,916,213 A | 10/1975 | Luteran | |
| 3,995,212 A | 11/1976 | Ross | |
| 4,137,527 A | 1/1979 | Tennenhouse et al. | |
| 4,276,454 A | 6/1981 | Zathan | |
| 4,373,389 A | 2/1983 | Decker | |
| 4,800,755 A | 1/1989 | Fathauer et al. | |
| 5,017,909 A | 5/1991 | Goekler | |
| 5,097,703 A | 3/1992 | Peter | |
| 5,365,783 A | 11/1994 | Zwelfel | |
| 5,610,611 A | 3/1997 | McEwan | |

(Continued)

FOREIGN PATENT DOCUMENTS

| | | |
|---|---|---|
| WO | 2008-090157 A1 | 7/2008 |
| WO | 2009073876 A1 | 6/2009 |
| WO | 2012032318 A1 | 3/2012 |

*Primary Examiner* — Francis C Gray
(74) *Attorney, Agent, or Firm* — Geoffrey E. Dobbin; Dobbin IP Law P.C.

(57) ABSTRACT

A sensor to measure dielectric constant of a medium may have a transmission line acting as a probe, and electronic circuit, and cable filter providing to reduce sensitivity of the sensor to cable parameters and influences. The sensor circuit may use a periodic signal generator to produce a carrier wave, which stimulates the transmission line, through a complex network coupling element. The complex impedance network forms a voltage divider with the transmission line, wherein the output of the voltage divider may be demodulated with an AM demodulator, such as a thermally compensated peak detector. This demodulated signal would be related to the characteristic impedance of the transmission line, and thus to the dielectric constant of the material surrounding the partially inserted transmission line probe. The demodulated signal may be offset, scaled, and linearized with a microcontroller containing signal processing routines, linearizing equations, stored calibration constants and look up tables.

10 Claims, 3 Drawing Sheets

(56) References Cited

U.S. PATENT DOCUMENTS

| | | | |
|---|---|---|---|
| 5,719,556 A | 2/1998 | Albin et al. | |
| 6,028,521 A | 2/2000 | Issachar | |
| 6,138,508 A | 10/2000 | Hannan et al. | |
| 6,192,752 B1 | 2/2001 | Blaine | |
| 6,457,355 B1 | 10/2002 | Philipp | |
| 7,150,190 B2 | 12/2006 | Krufka et al. | |
| 7,509,856 B1 | 3/2009 | Winkens et al. | |
| 7,823,447 B2 | 11/2010 | Harazin et al. | |
| 7,992,437 B2 | 8/2011 | Tshishiku | |
| 8,576,085 B2 | 11/2013 | Kessinger | |
| 2004/0105380 A1* | 6/2004 | Cho | B82Y 10/00 369/126 |
| 2009/0134889 A1* | 5/2009 | Gunsay | A01G 25/167 324/694 |
| 2009/0148306 A1 | 6/2009 | Drechsel et al. | |
| 2010/0301878 A1* | 12/2010 | Armbruster | G01F 23/0061 324/676 |
| 2011/0270542 A1 | 11/2011 | Chappell et al. | |
| 2013/0233072 A1 | 9/2013 | Milone | |
| 2015/0323372 A1* | 11/2015 | Gunsay | G01F 23/26 73/304 C |

\* cited by examiner

FILTERED DIELECTRIC SENSOR APPARATUS

CROSS-REFERENCES TO RELATED APPLICATIONS

This Application claims priority as a non-provisional perfection of U.S. Application No. 62/517,785, filed Jun. 9, 2017, and as a Continuation-in-Part Application of prior filed U.S. application Ser. No. 14/709,212, filed May 11, 2015, and incorporates both of these applications by reference herein in their entirety.

FIELD OF THE INVENTION

The present invention relates to the field of dielectric sensors and more particularly relates to a dielectric sensor coupled to a cable through a filter.

BACKGROUND OF THE INVENTION

Dielectric sensors are used in many applications. For example, without limitation, they can be used to measure liquid density of a medium or as liquid level sensors. The density of a substance or substances with known dielectric constant can be inferred from the measured dielectric constant of a medium. Water has one of the highest dielectric constants and so dielectric sensors are particularly well suited at measuring the density and level of water. For purposes of this invention, a "liquid level sensor" is a sensor which will establish the relative location to which a given liquid fills a container (e.g. the top of the fluid in a tank). Such containers may be manmade or natural and may include channels in which liquids flow. The liquids contained therein may be static or moving. Whereas a "moisture content sensor" will determine the amount of moisture (which may be from any type of liquid) in a given sample of a medium.

The dielectric constant of a medium can be measured in various ways. The dielectric constant of a material can affect capacitance of capacitor plates, and the characteristic impedance of transmission lines. In the case of capacitive dielectric sensors (see, U.S. Pat. No. 4,924,702 and U.S. Pub. App. No. 2009/0148306 A1), two or more plates are electrically coupled to the medium under test, and typically the dielectric constant of a medium is inferred by changes to frequencies of oscillators that use the coupled capacitive plates as an oscillator element, or changes to rise time of pulses across the coupled capacitive plates. In the case of transmission line dielectric sensors (see, U.S. Pat. Nos. 3,995,212 and 5,610,611), electrical pulses are sent down a transmission line of fixed length which is electrically coupled to a medium under test, and the transit time of the reflected pulses are detected, and then correlated to the dielectric constant, as it is a function of the reflected pulse time.

Alternatively, the dielectric constant of a medium can be measured using transmission lines with known length and known end load and coupled to the medium under test (see, US Pub. App. Nos. 2009/0134889 and 2015/0323372). In these structures, the dielectric constant may be measured by electrically stimulating the line with a repetitive signal to determine the characteristic impedance of the transmission line segment at the transmission source, and from this characteristic impedance inferring the dielectric constant. These sensors often employ an AM peak detector circuit to measure the characteristic impedance of the transmission line segment. This structure of sensor may be utilized for many different purposes. For instance, the immediately above referenced applications disclose both a moisture content sensor and a liquid level sensor, respectively.

It is common for dielectric sensors to employ cables of wires for powering the sensors from a remote power source, and for reporting data back to a remote data logger or reader. It has been observed that, for transmission line based dielectric sensors in particular, measurements can be adversely affected by cable length, coils in the cable, and the proximity of the cable to other dielectric materials including humans touching the cable.

In view of the foregoing, there is a need to provide a dielectric sensor apparatus that is insensitive to cable length, cable coiling, and cable proximity to other dielectric materials.

The present invention is a transmission line dielectric sensor which utilizes a cable filter to reduce the sensor's sensitivity to extraneous dielectric feedback. The present invention represents a departure from the prior art in that the dielectric probe of the present invention allows for use while cancelling the effects of cable length, cable coiling, and cable proximity to other dielectric materials.

SUMMARY OF THE INVENTION

In view of the foregoing disadvantages inherent in the known types of transmission line based dielectric sensor sensing apparatuses, this invention provides an improved dielectric sensor. As such, the present invention's general purpose is to provide a new and improved transmission line dielectric sensor that is insensitive to the length, coiling, or proximity to other dielectric materials of its power and data cables.

To accomplish these objectives, the dielectric sensor comprises a periodic signal generator, a coupled transmission line probe, a temperature compensated peak detector circuit with differential amplifier, microcontroller with ADC and stored calibration coefficients, and cable filter.

The more important features of the invention have thus been outlined in order that the more detailed description that follows may be better understood and in order that the present contribution to the art may better be appreciated. Additional features of the invention will be described hereinafter and will form the subject matter of the claims that follow.

Many objects of this invention will appear from the following description and appended claims, reference being made to the accompanying drawings forming a part of this specification wherein like reference characters designate corresponding parts in the several views.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also, it is to be understood that the phraseology and terminology employed herein are for description and should not be regarded as limiting.

As such, those skilled in the art will appreciate that the conception, upon which this disclosure is based, may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

Figure 1:
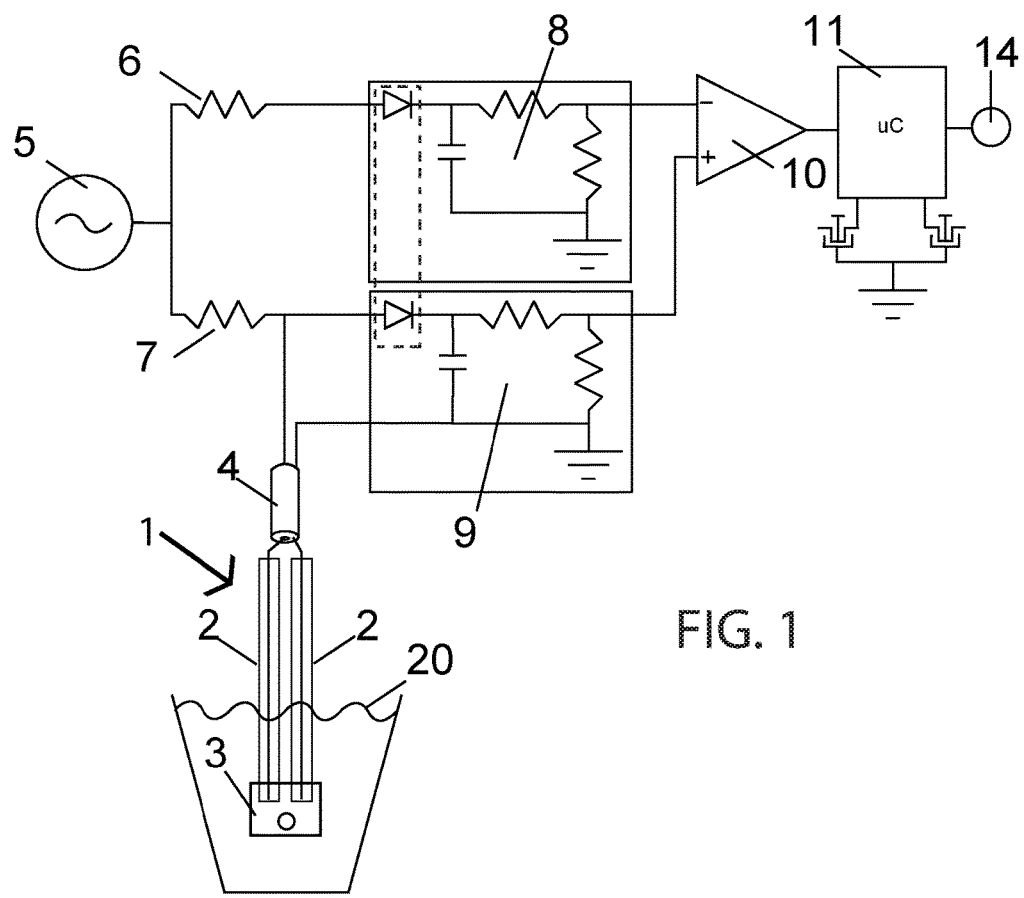
FIG. 1 is a is a circuit diagram of one embodiment of a dielectric sensor incorporating a transmission line probe submersed into a medium, which may be seen in the parent application, U.S. Ser. No. 14/709,212.

The listed reference numerals are used to denote the following parts in all figures:

1 transmission line probe;
2 insulation around wires;
3 weighted clamp;
4 transmission line to probe;
5 periodic voltage function generator;
6 reference complex impedance network;
7 complex impedance network;
8 reference peak detector;
9 probe signal peak detector;
10 differential amplifier;
11 microcontroller;
12 sensor return network;
13 sensor power voltage network node;
14 output from dielectric sensor;
15 cable filter;
16 connector;
17 cable;
18 data output from cable;
19 DC voltage source;
20 liquid medium whose dielectric constant is being measured;
21 output of the differential amplifier;
22 PCB with embedded transmission line;
23 soil;
S sensor;
L liquid level;
$\mathcal{L}$ length of transmission line probe 1;
$\ell1$ length of transmission line probe 1 in first fluid (air);
$\ell2$ length of length of transmission line probe 1 in second fluid (medium 20).

DETAILED DESCRIPTION OF THE PREFERRED EMBODIMENT

With reference now to the drawings, a preferred embodiment of the filtered dielectric sensor apparatus is herein described. It should be noted that the articles "a", "an", and "the", as used in this specification, include plural referents unless the content clearly dictates otherwise.

Figure 2:
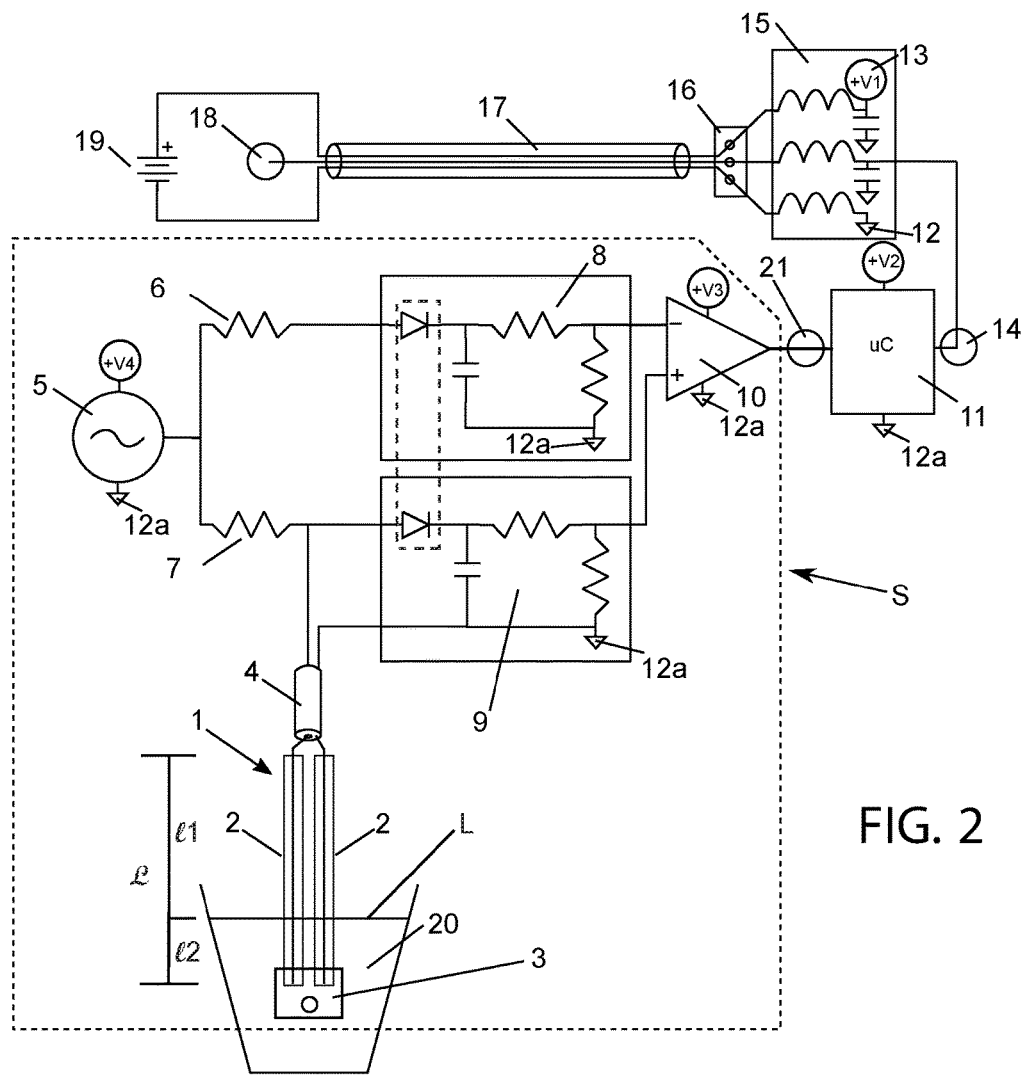
FIG. 2 is a circuit diagram of one embodiment of a dielectric sensor incorporating a transmission line probe submersed into a liquid medium, which utilizes a cable filter.
Figure 3:
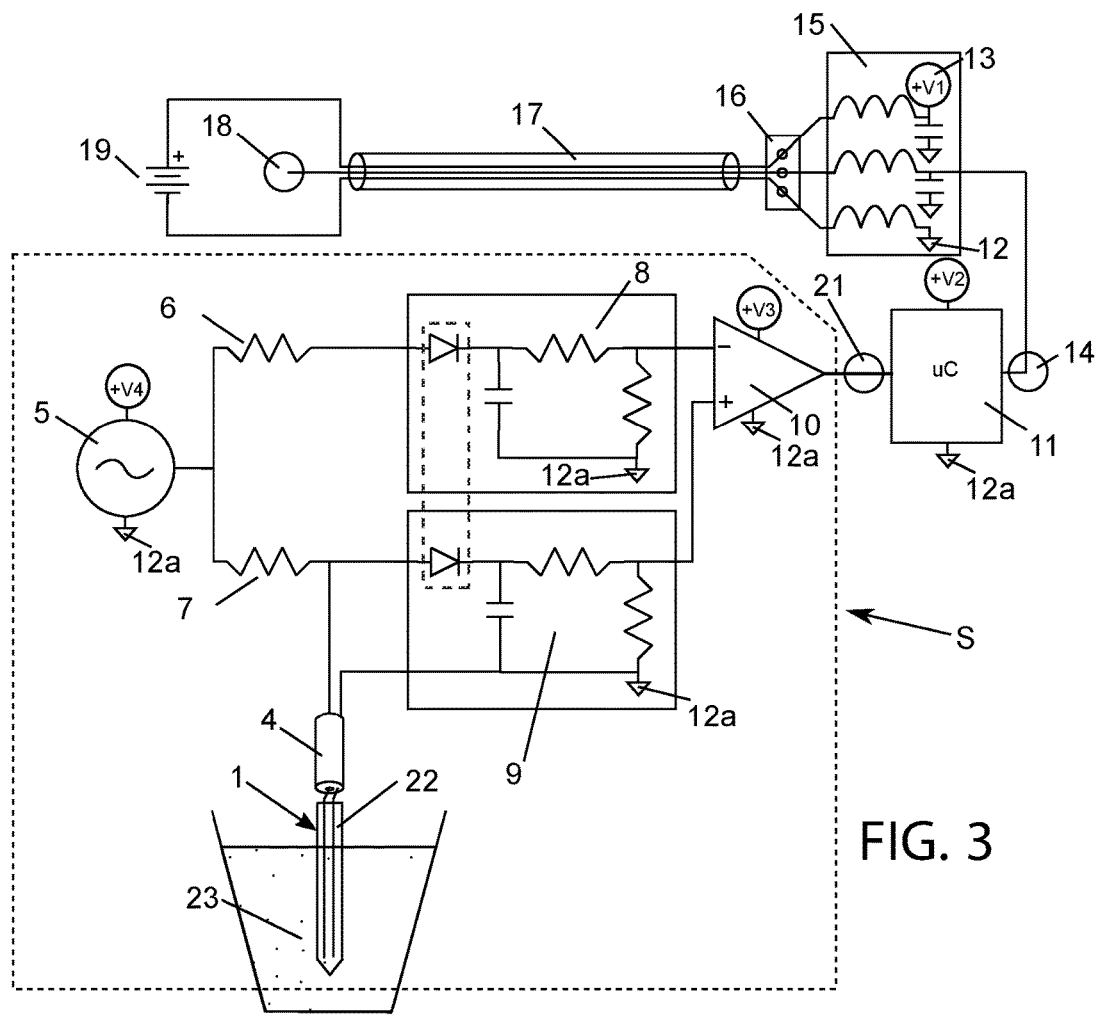
FIG. 3 is a circuit diagram of another embodiment of a dielectric sensor incorporating a transmission line probe submersed into a soil medium, which utilizes a cable filter.

Block diagrams of the preferred embodiment is shown in FIGS. 2 and 3 while a non-filtered sensor described in the parent application, U.S. Ser. No. 14/709,212, is shown in FIG. 1. The illustrated dielectric sensor S may be used for either a liquid level sensor (FIG. 2) or a moisture content sensor (FIG. 3). In cases where the dielectric sensor is being used as a moisture sensor, the voltage output 21 from the analog circuit is non-linear with moisture content and the microcontroller 11 can linearize the signal by use of a look-up table or transforming the signal through a linearizing signal processing function. When being used as a liquid level sensor (FIG. 2) the voltage output 21 is nearly linear with the liquid level L and does not normally require such transformation. Liquid level L is defined as the location of a fluid boundary (in this case between the target liquid 20 and air) relative to the transmission line probe 1. When used as a liquid level sensor, the transmission line probe 1 has a length $\mathcal{L}$ divided into two sections: $\ell1$ in fluid 1 (air) and $\ell2$ in fluid 2 (medium 20). The resultant signal is used to determine the relative lengths of $\ell1$ and $\ell2$. When the transmission line probe's location relative to the container is known, the transition between $\ell1$ and $\ell2$, which is L, may then be calculated relative to the container. It should be readily understood that various fluids of different dielectric constants may be measured in the same manner, including more than two fluids in the same container. The sensor S may be configured for either purpose and merely requires appropriate programming and information to be resident in the microprocessor 11. Therefore, it is to be readily understood that the filtering mechanism may be utilized with any dielectric sensor in any relevant implementation paradigm.

In FIG. 1, a transmission line probe 1 is formed by a pair of insulated wires 2 that are kept in a roughly parallel relationship with each other. The transmission line probe can consist of any pair of insulated wires 2 with the medium submersed end sealed. Common twisted pair transmission line cable, or non-twisted parallel pair wire such as common speaker wire can be used. In addition, transmission lines created with printed circuit boards 22 can also be used for rigid probes, such as for soil (FIG. 3). When flexible cables are used for the probe, a clamp or weight, such as a weighted clamp 3 is used to keep the cable taut in undulating liquid. The clamp 3 may be also bolted to the side of a reservoir. This clamp or weight 3 can also be used to seal the end of the transmission line if it is made of cut wire. A separate seal can also be used on the end of the submerged transmission line 1. Alternatively, a flexible transmission line can be braced with a rigid material so that it remains stationary in undulating liquid.

The transmission line probe 1 is connected to a complex impedance network 7 by a transmission line 4, which may be any sufficiently insulated line. A periodic function generator 5 provides a carrier frequency through the resistive or complex impedance network 7 to the transmission line probe 1 of one or more segments, which is partially submerged in a target dielectric medium 20. The target dielectric medium 20 could be any substance or mixture of substances including solids, liquids, gasses. The invention may also be utilized to determine the content of various fluids, such as fresh water, salt water, oil, gasoline, kerosene, or any other fluid. In addition, the target medium could consist of distinct layers of substances with different dielectric constants, for example in the case of a fluid reservoir where the dielectric sensor is used to detect fluid level, and measures the average dielectric constant of both fluid, and the air above the fluid.

The complex impedance network 7 and the transmission line 4 form a voltage divider whose output voltage magnitude is related to the impedance of the transmission line probe 1. The magnitude of the voltage divided signal will vary according to the dielectric constant of the medium surrounding the partially submersed transmission line probe 1. The output of this voltage divider is fed to an AM (Amplitude Modulated) demodulator, typically a peak detector 9, to remove the carrier frequency, and rendering a voltage which is related to the moisture surrounding the transmission line probe 1. One skilled in the art of electronics will recognize that any AM demodulation circuit could be used in place of the peak detector circuit illustrated, including diode configured transistors.

Because diodes are temperature sensitive, temperature compensation is needed for environments where temperature may fluctuate, thus a second peak detector 8 is used as a temperature reference and is fed by the same oscillator through a second complex impedance network 6, normally identical in form to the first complex impedance network 7. The diodes in both peak detectors are typically thermally coupled, as shown schematically in the Figures, and located together in a diode array package. The signal from the reference peak detector 8 cancels out the temperature fluctuations of the probe peak detector 7, by means of the differential amplifier 10, as the temperature fluctuations are common mode and rejected by the differential amplifier 10.

The signal generator 5 may produce any periodic carrier frequency of sufficient frequency to stimulate the transmission line. Many data electronic recording systems and microcontrollers already have numerous oscillators or clock sources which can be used for this purpose. It is well known by those skilled in the art of electronics that all periodic waves can be band pass filtered or low pass filtered if the desired frequency is the fundamental frequency of the waveform, to produce a single frequency carrier.

It is also well known that the reactance of transmission lines alternates, as the transmission line length increases, between negative and positive values every quarter wavelength of the carrier frequency. For example, a transmission line with an open circuit load has a negative reactance and looks capacitive when the length of the line is less than a quarter wavelength of the carrier, and a positive reactance from above a quarter wavelength to below one half a wave length, and so on. The even quarter wavelength nodes are resonance points. Thus, in practice the carrier and the length of the transmission line are selected such that the reactance does not change polarity over the range of possible dielectric levels. For example, the length of an open load transmission line could be chosen to be less than one quarter of a wavelength such that the reactance is negative. For applications where it is desired that the length of the transmission line be maximized, a lower carrier frequency should be used.

The complex impedance networks 6 and 7 will typically be composed of single resistors, but other reactive elements such as inductors or capacitors, or combinations thereof, in various topologies such as Pl- and T-networks can be used. This network can have the secondary purposes of filtering the signal from the signal generator to remove unwanted harmonics and matching the signal to the transmission line.

The output of the differential amplifier 21 can be digitized using various methods, including the use of an analog to digital converter (ADC). This digitized signal can be passed through an output data line (between ADC 10 and microcontroller 11) to a microcontroller 11 or computer system for further processing, such as averaging to remove noise and determination of the dielectric level. The relationship between the voltage from the demodulator and the dielectric level (either by moisture content and/or liquid level) can be derived from a look-up table in the microcontroller 11 or a memory associated with the microcontroller 11 which contains known relationship values for voltage and dielectric reading or by applying an equation if the relationship can be described by an equation. Many microcontrollers have integrated ADCs and differential amplifiers which can be used for the ADC and differential amplifier elements of circuit. If the temperature dependency of the dielectric is known, and the microcontroller 11 can access this through a secondary sensor, then the output signal may be compensated for this dependency through computations on the microcontroller 11.

The output 14 of the microcontroller 11 is a signal that represents the dielectric information and can be in analog, RF, digital or visual, or aural form. Common methods of producing analog outputs are via digital to analog converters or pulse width modulators. Other common digital outputs include I2C, SPI, 1-Wire, USB, etc. Likewise, the output could be in the form of a visual display, or audible output.

In the improved sensor of the preferred embodiment (FIGS. 2 and 3), sensors typically are connected to remote data loggers 18 and a power source 19 through one or more input-output data lines (between output 14 and data logger 18) and power lines in the form of a wire cable 17. The cable may be hard wired to the circuit, or alternatively attachable to the circuit through a connector 16. One skilled in the art would realize that the cable could take other forms such as the traces of a printed circuit board. One skilled in the art may also appreciate that the illustrated input-output data line is extending from the microprocessor, but additional data lines or power lines may extend from any other location on the sensor. For convenience, one could define two sides of the circuit at a given component: the "power" side and the "sensor" side. The "sensor" could be defined to include all the elements contained in box S in FIGS. 2 and 3 (except medium 20, 23), though this definition is arbitrary and only made for convenience. In this manner, a first component of the circuit could be defined as being on either the power side or sensor side of another component) to locate the first component within the circuit path. For example, connector 16 is to the sensor side of cable 17, but on the power side of cable filter 15.

The improved sensor apparatus has a power voltage network typically corresponding to the positive terminal of the power source 19, which may be any source of voltage, such as a battery, and a return voltage network which typically corresponds to the negative terminal of the power source 19. Each node 13 of the power voltage network is electrically derived from the power voltage network and their individual potentials may or may not be the same (thus labeling them $V_1$, $V_2$, etc.). Each node of the return voltage network 12a connects back to the primary return node 12 through either ground, wires, circuit boards, or other electrical conduit. In effect, then, each power return node 12a is equivalent to the primary return node 12. These power networks, along with any data input-output lines, are coupled to the cable-connector or hardwired cable through a filter network 15. Each data input-output line and the positive (sensor) side of the circuit are individual LC circuits with of an inductor and a capacitor in series, shunted to the sensor's return voltage network 12. In the case of the sensor's return voltage network 12 itself, no shunted capacitor is needed, as it would be extraneous. The filter network provides isolation between the cable and sensor, forms a virtual ground for the sensor at the primary return voltage node 12, and decreases the sensitivity of the sensor to cable parameters such as length, coiling and proximity to other dielectric materials, and creates a low-pass filter that chokes high frequencies from entering the cable and in turn becoming a source of unwanted electrical emissions. Without the filter, the ground reference point is effectively blurred by the cable. The virtual ground created by the filter 15 stabilizes and localizes the voltage reference of the sensor, creating stability in the sensor results regardless of cable parameters. As such, any power or data line which extends from the sensor must be filtered with an inductor and, unless it is the return voltage network 12, a shunted capacitor.

A multi-segment transmission line 4 which feeds the transmission line probe 1 may not be needed for all applications but can be useful in applications where the transmission line probe 1 needs to be placed remotely in a medium where some liquid or moisture information desired to be obtained (either a moisture content or a liquid level in a container, or other information). According to the application of the device, a simple method to calibrate the device is needed. For example, the dielectric constant of fresh water, salt water and oil are different. These calibration values may be recorded and stored in a microcontroller 11. The recorded calibration values are then used by the microcontroller to adjust the output of the sensor such that the output 14 is offset and scaled to give full range or other useful ranges.

Accordingly, the reader will see that the dielectric sensor of this invention uses low-cost, low-power electronics, including off-the-shelf transmission lines, is temperature compensated, is insensitive to power and data cable parameters, and can be easily calibrated for several solid and liquid materials, probe lengths, and purposes.

Although the present invention has been described with reference to preferred embodiments, numerous modifications and variations can be made and still the result will come within the scope of the invention. No limitation with respect to the specific embodiments disclosed herein is intended or should be inferred. For example, a variety of the probe element types and geometries could be used. Thus, the scope of the invention should be determined by the appended claims and their legal equivalents, and not by the examples given.

What is claimed is:

1. A dielectric sensor apparatus comprising:
   a. a sensor assembly further comprising:
      i. a voltage signal generator which provides a carrier frequency;
      ii. a transmission line probe of one or more segments and being formed of two parallel input lines, where one input line is coupled to a fixed potential, and one input line is coupled to the signal generator through a complex impedance network; and
      iii. an AM demodulator coupled to the transmission line probe, providing an output voltage through at least one output data line, whereby the dielectric level of the material may be determined;
   b. a microprocessor coupled to the output data line and further coupled to at least one input-output data line which connects to a filter assembly;
   c. a power voltage network further comprising a network voltage source, a plurality of power nodes within the dielectric sensor apparatus and a power voltage line connected to the network voltage source;
   d. a return voltage network with a plurality of return nodes within the dielectric sensor apparatus and a return voltage line connected to the network voltage source;
   e. a cable of wires which includes the power voltage line, the return voltage line and the at least one input-output data line; and,
   f. the filter assembly, located on a sensor side of the cable, further comprising, on each of the at least one input-output data line and the power line of the power voltage network, an inductor in series with the cable and a capacitor, on a sensor side of the inductor and shunted to the return voltage network, and, in the return voltage network, an inductor in series with the cable, wherein the transmission line probe is inserted into a medium having a dielectric constant and the AM demodulator provides an output voltage signal correlated to the medium's dielectric constant and a length of the transmission line probe that is inserted in the medium.

2. The dielectric sensor apparatus of claim 1, the apparatus being utilized as a moisture measuring tool.

3. The dielectric sensor apparatus of claim 2, the moisture measuring tool being selected from the set of moisture content measuring tools consisting of: a liquid level sensor and a moisture content sensor.

4. The dielectric sensor apparatus of claim 1, further comprising at least one additional data line extending from the sensor to the filter assembly, the at least one additional data line being filtered by an inductor in series with the sensor and cable and the line being shunted to the return voltage network.

5. The dielectric sensor apparatus of claim 1, further comprising at least one additional power line extending from the sensor to the filter assembly, the at least one additional power line being filtered by an inductor in series with the sensor and cable and the line being shunted to the return voltage network.

6. A dielectric sensor apparatus comprising:
   a. a sensor assembly further comprising:
      i. a voltage signal generator which provides a carrier frequency;
      ii. a transmission line probe of one or more segments and being formed of two parallel input lines, where one input line is coupled to a fixed potential, and one input line is coupled to the signal generator through a complex impedance network;
      iii. an AM demodulator further comprising a temperature compensated peak detector circuit comprised of two peak detector circuits whose diodes are thermally coupled, with an input of one peak detector coupled to the said transmission line probe through the said complex impedance network and an input of the second peak detector coupled to the said signal generator through a second complex impedance network, and with the outputs of both peak detectors; and
      iv. a differential amplifier coupled to outputs of both peak detector circuits, providing an output voltage through at least one output data line, whereby common mode temperature fluctuations are removed and the dielectric level of the material may be determined;
   b. a microprocessor coupled to the output data line and further coupled to at least one input-output data line which connects to a filter assembly;
   c. a power voltage network further comprising a network voltage source, a plurality of power nodes within the dielectric sensor apparatus and a power voltage line connected to the network voltage source;
   d. a return voltage network with a plurality of return nodes within the dielectric sensor apparatus and a return voltage line connected to the network voltage source;
   e. a cable of wires which includes the power voltage line, the return voltage line and the at least one input-output data line; and,
   f. the filter assembly, located on a sensor side of the cable, further comprising, on each of the at least one input-output data line and the power line of the power voltage network, an inductor in series with the cable and a capacitor, on a sensor side of the inductor and shunted to the return voltage network, and, in the return voltage network, an inductor in series with the cable
wherein the transmission line probe is inserted into a medium having a dielectric constant and the AM demodulator provides an output voltage signal correlated to the medium's dielectric constant and a length of the transmission line probe that is inserted in the medium.

7. The dielectric sensor apparatus of claim 6, the apparatus being utilized as a moisture measuring tool.

8. The dielectric sensor apparatus of claim 7, the moisture measuring tool being selected from the set of moisture content measuring tools consisting of: a liquid level sensor and a moisture content sensor.

9. The dielectric sensor apparatus of claim 6, further comprising at least one additional data line extending from the sensor to the filter assembly, the at least one additional data line being filtered by an inductor in series with the sensor and cable and the line being shunted to the return voltage network.

10. The dielectric sensor apparatus of claim 6, further comprising at least one additional power line extending from the sensor to the filter assembly, the at least one additional power line being filtered by an inductor in series with the sensor and cable and the line being shunted to the return voltage network.

\* \* \* \* \*